United States Patent
Deppe et al.

(10) Patent No.: US 7,411,837 B2
(45) Date of Patent: *Aug. 12, 2008

(54) METHOD FOR OPERATING AN ELECTRICAL WRITABLE AND ERASABLE MEMORY CELL AND A MEMORY DEVICE FOR ELECTRICAL MEMORIES

(75) Inventors: Joachim Deppe, Dresden (DE); Mark Isler, Dresden (DE); Christoph Ludwig, Langebrück (DE); Jens-Uwe Sachse, Dresden (DE); Jan-Malte Schley, Dresden (DE); Ricardo Pablo Mikalo, Waltersdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/600,425

(22) Filed: Nov. 16, 2006

(65) Prior Publication Data

US 2007/0058443 A1    Mar. 15, 2007

Related U.S. Application Data

(63) Continuation of application No. 11/072,694, filed on Mar. 4, 2005, now Pat. No. 7,145,807.

(30) Foreign Application Priority Data

Mar. 5, 2004   (DE) ....................... 10 2004 010 840

(51) Int. Cl.
  *G11C 11/34* (2006.01)
  *G11C 16/06* (2006.01)
  *G11C 16/04* (2006.01)

(52) U.S. Cl. ............................ 365/185.28; 365/185.03; 365/185.24

(58) Field of Classification Search .................. 365/185
See application file for complete search history.

(56) References Cited

U.S. PATENT DOCUMENTS

| 5,768,192 | A   | 6/1998  | Eitan |
| 6,011,725 | A   | 1/2000  | Eitan |
| 6,215,148 | B1  | 4/2001  | Eitan |
| 6,339,540 | B1* | 1/2002  | Lavi ........................... 365/49 |
| 6,348,711 | B1  | 2/2002  | Eitan |
| 6,477,084 | B1  | 11/2002 | Eitan |

(Continued)

FOREIGN PATENT DOCUMENTS

JP    2000-514946    11/2000

(Continued)

OTHER PUBLICATIONS

Japanese Patent Office, Translation of Office Action for Application No. 2005-63161, Nov. 19, 2007.*

(Continued)

*Primary Examiner*—Huan Hoang
*Assistant Examiner*—Michael J Weinberg
(74) *Attorney, Agent, or Firm*—Slater & Matsil, L.L.P.

(57) ABSTRACT

A method is provided for operating an electrical writable and erasable memory cell, which has a channel region that can be operated in a first and a second direction, wherein information is stored as the difference of an effective parameter.

43 Claims, 3 Drawing Sheets

U.S. PATENT DOCUMENTS

| | | |
|---|---|---|
| 6,574,139 B2 * | 6/2003 | Kurihara ................. 365/185.03 |
| 6,590,811 B1 * | 7/2003 | Hamilton et al. ........ 365/185.22 |
| 6,594,181 B1 * | 7/2003 | Yamada .................. 365/185.21 |
| 6,664,588 B2 | 12/2003 | Eitan |
| 6,799,256 B2 * | 9/2004 | Van Buskirk et al. ....... 711/156 |
| 7,116,579 B2 | 10/2006 | Morikawa et al. |
| 2004/0042270 A1 | 3/2004 | Huang et al. |

FOREIGN PATENT DOCUMENTS

| | | |
|---|---|---|
| JP | 2004-348809 | 12/2004 |
| WO | WO 98/03977 | 1/1998 |
| WO | WO 99/60631 | 11/1999 |

OTHER PUBLICATIONS

Eitan, B., "NROM: A Novel Localized Trapping, 2-Bit Nonvolatile Memory Cell," IEEE Electron Device Letters, vol. 21, No. 11, Nov. 2000, pp. 543-545.

* cited by examiner

PRIOR ART

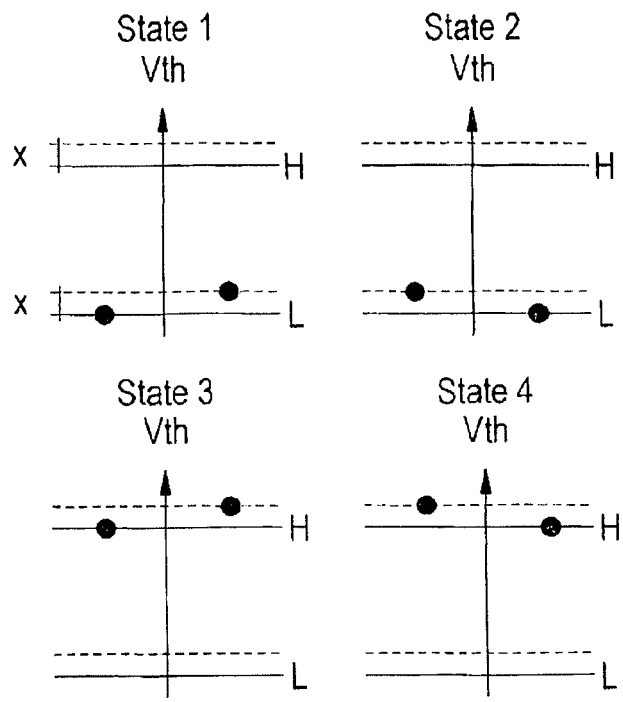
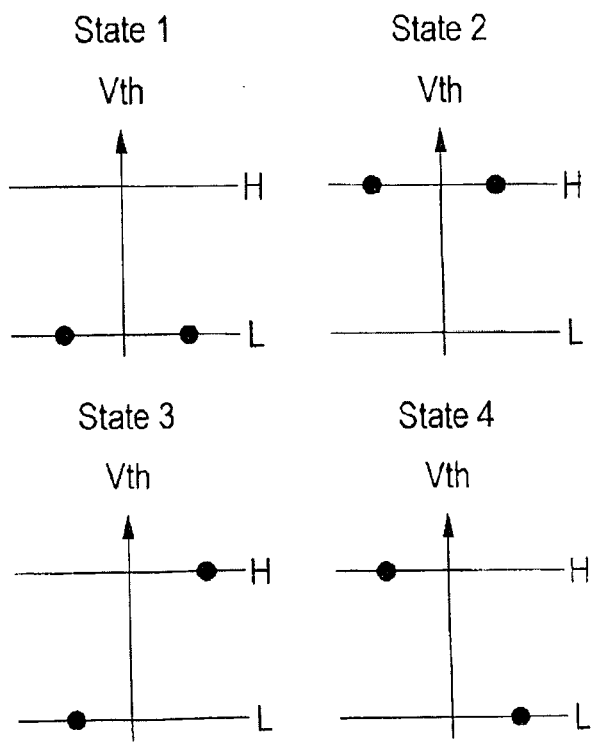
PRIOR ART

METHOD FOR OPERATING AN ELECTRICAL WRITABLE AND ERASABLE MEMORY CELL AND A MEMORY DEVICE FOR ELECTRICAL MEMORIES

This application is a continuation of U.S. patent application Ser. No. 11/072,694, filed on Mar. 4, 2005, now U.S. Pat. No. 7,145,807, which application claims priority to German Patent Application 102004010840.4, which was filed Mar. 5, 2004, both of which are incorporated herein by reference.

TECHNICAL FIELD

The invention relates to a method for operating an electrical writable and erasable memory cell and a memory device for the electrical writable and erasable non-volatile memory cells.

BACKGROUND

Electrical writable and erasable non-volatile memory cells, which can especially be used in a virtual ground NOR architecture, also include so-called charge trapping memory cells, in which, between the channel region and/or the source/drain region and the gate electrode, there is a part of the gate dielectric having a non-conducting memory layer between boundary layers for the trapping of charge carriers and thus for changing the programming state of the memory cell. Such memory cells are described for example in U.S. Pat. No. 5,768,192, U.S. Pat. No. 6,011,725 and PCT Patent Publication WO 99/60631. In these memory cells each boundary layer is an oxide and the memory layer is a nitride of the semiconductor material, usually silicon.

Charge-trapping memory cells are preferably programmed by channel hot electrons (CHE) and can be erased with hot holes from the channel region or by Fowler-Nordheim tunnels. A SONOS memory cell provided for a special operating mode with a read voltage (reverse-read) applied in the opposite direction to the programming process, having a thickness of the boundary layers matched to this operating mode, is usually designated as an NROM memory cell. Further details on this can be found in Boaz Eitan et al.: "NROM: A Novel Localized Trapping, 2-Bit Non-Volatile Memory Cell" in IEEE Electron Device Letters 21, 543-545 (2000).

The memory layer of a charge-trapping memory cell is located between a boundary layer comprising a material having a higher band gap than the band gap of the memory layer so that the charge carriers captured in the memory layer remain localized there. A nitride is preferably considered as material for the memory layer. An oxide is primarily suitable as surrounding material. As an example of such an oxide-nitride-oxide (ONO) memory layer sequence in the material system of silicon, the silicon nitride memory layer is provided with a band gap of about 5 eV. The surrounding boundary layers are silicon oxide having a band gap of about 9 eV.

The memory layer can be a different material whose band gap is smaller than the band gap of the boundary layers wherein the difference of the band gaps should be as large as possible for good electrical confinement of the charge carriers. In conjunction with silicon oxide as the boundary layer, for example, tantalum oxide, hafnium silicate, titanium oxide (in the case of a stoichiometric composition $TiO_2$), zirconium oxide (in the case of a stoichiometric composition $ZrO_2$), aluminum oxide (in the case of a stoichiometric composition $Al_2O_3$), or intrinsically conducting (undoped) silicon can be used as the material of the memory layer.

Such a 2-bit NROM memory cell is programmed, as described for example in PCT Patent Publication WO 98/03977, such that by means of a gate voltage and a drain source voltage in the channel region of the memory cell, a vertical and a lateral electric field is produced which accelerates the electrons along the channel length. Some electrons are accelerated such that in the vicinity of the drain region where the electric field is strongest, they jump over the potential barrier and reach the nitride layer. In this way, the threshold voltage of the channel region changes, which can be detected by applying a read voltage in the reverse direction. The second bit in this memory cell is programmed by exchanging drain and source compared with the previous described programming process for writing the memory cell and thus the significant adjustment of charges into the charge-trapping layer. In this way, 2-bit information can be stored in a non-volatile memory cell, such as an NROM cell for example.

A disadvantage of this known procedure is that during incorporation of charges into the charge trapping layer on one side of such a cell, reactions are observed on the threshold voltage of the respectively other side of the memory cell. So-called crosstalk thus results. The crosstalk increases with increasing difference between the threshold voltages of the two sides of a cell.

That crosstalk may have the following influences. For reading a NROM memory cell a particular gate voltage and particular drain/source voltage is supplied to the cell. Drain and source are defined so that the desired part of the cell will be read. If no charge is stored in the charge-trapping layer a significant drain current will flow if a specific gate voltage is supplied. When a particular charge is stored in the charge-trapping layer (the nitride layer), this charge will hinder the development of a channel between source and drain and no drain current will flow at the same gate voltage or the drain current will be at least significantly lower. This behavior is viewable in a usual transfer characteristic. Programming of one side of the NROM cell can result in a modification of the transfer characteristic of the other side so that, for an example, a drain current will flow even when no charge was stored within the charge trapping layer.

As the technology is further developed, the effective channel length and thus the physical distance between the charges of both sides of a cell decreases. This results in stronger crosstalk. It can thus be reckoned that in the future there will be an increased number of errors that come about as a result of crosstalk.

SUMMARY OF THE INVENTION

In one aspect, the invention provides a memory device for electrical writing and erasing of memory cells and a method for operating such a memory device in which the occurrence of the aforementioned errors is avoided.

Selecting the threshold voltage as an effective parameter will minimize the effect of crosstalk by the fact that too-large threshold voltage differences never come about between the two sides of a cell. This is especially achieved by at least some of the information, namely one bit, being stored as a difference in the threshold voltage of the channel region, which in turn is not influenced by crosstalk and the occurrence of errors as a result of crosstalk in the memory cell is avoided. Furthermore, as a result of programming using a threshold voltage difference the use of a reference cell is avoided. If only the information of the effective parameter difference is used, a one bit memory cell can be achieved having a great reliability.

Further advantageous embodiments are specified in the dependent claims. Especially as a result of the fact that in addition to the threshold voltage difference, a voltage range is specified within which the threshold voltage lies from the absolute magnitude, it can be achieved with this measure that by stipulating two or more voltage ranges, more than two bits can be stored in a memory cell.

The invention is explained subsequently with reference to the drawings using exemplary embodiments.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 is an exemplary embodiment of the storage of four states in a non-volatile memory cell; and FIG. 5 is the hitherto conventional procedure for storage of four states in a conventional NROM memory cell.

The following list of reference symbols can be used in conjunction with the figures.

| 1 | Substrate | C1 | Charge region 1 |
|---|---|---|---|
| 2 | Gate structure | C2 | Charge region 2 |
| 3 | Insulation | AS | Address control |
| 4 | Clock control | RD | Series decoder |
| 5 | Data output | ST | State control |
| G | Gate connection | SA | Write amplifier |
| GL | Gate lead | BD | Multi-bit decoder |
| D/S | Drain/source area | BLD | Bit line decoder |
| BL | Bit line | | |

DETAILED DESCRIPTION OF ILLUSTRATIVE EMBODIMENTS

Figure 1:
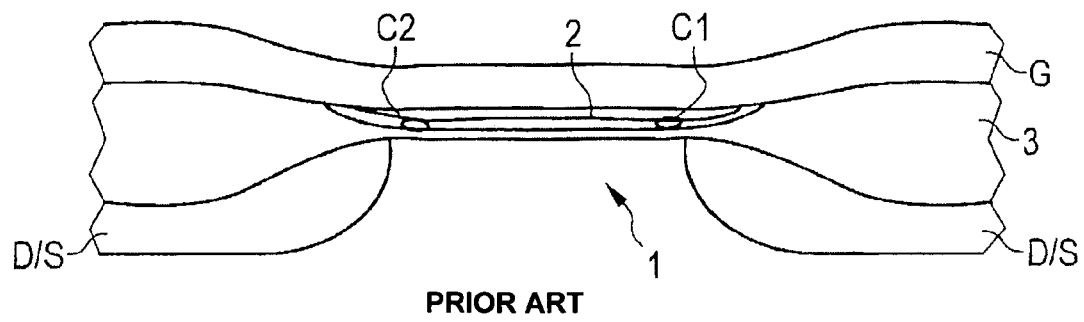
FIG. 1 is a first example of an NROM memory cell.

FIG. 1 shows the fundamental structure of a conventional NROM memory cell. Arranged on a substrate 1 are drain/source regions D/S at a distance from one another, between which a gate structure 2 is constructed. The gate structure 2 includes three layers with the layer succession of an oxide layer, a nitride layer and an oxide layer. The gate structure 2 is completed by a covering gate contact G via, which the gate voltage is applied via the gate structure 2. The gate contact G is in this case separated from the drain/source regions D/S by means of insulation 3 which is an oxide. Thus, the NROM cell corresponds to the structure of an MOS transistor, which is called in the following "the cell transistor."

Thus, as already described in the introduction to the description, depending on which of the two regions D/S is respectively the drain or the source, a charge is stored or deleted in the gate structure 2 in region C2 or in region C1. The charge storing is effected to the nitride layer by so-called hot electron injection. Erasing is effected by so called Fowler-Nordheim tunneling. In this case, programming takes place in the region C1 or C2 physically adjacent to the respective drain region. The programmed information is detected by the read direction inverse to the programming or writing. Detecting of the stored information is effected by the threshold voltage or cut-off voltage of the cell transistor. Reading the stored charge adjacent to the source region is relevant.

FIG. 4 shows the programming states in accordance with the state programming according to the invention. In this case, the filled circles respectively show the value of the threshold voltage for the left and right side of a memory cell. In state 1 the threshold voltage in the left region lies below the threshold voltage in the right region wherein the state is consequently determined by the threshold voltage difference determined from left to right on the threshold voltage level L. This means that a memory cell, as shown for example in FIG. 1, is programmed once on the left and once on the right by exchanging drain and source on the "L" level, the programming being accomplished such that the threshold voltage in the right part of the cell is higher than that in the left part and a threshold voltage difference is obtained within one region.

State 2 is now obtained in analogous form, wherein the threshold voltage in the left part is higher than that in the right part. The difference considered absolutely between state 1 and state 2 is the same, with merely the mathematical sign of the difference of the two threshold voltages being decisive for determining the stored logical state.

State 3 and state 4 in FIG. 4 are obtained in a comparable fashion to state 1 and state 2, the threshold voltages shown here being located in the range of the "H" level. Here also, the sign of the respective difference is decisive for the difference between state 3 and state 4. The usual programming, as shown in FIG. 5, takes place in the form that, for example, state 1 is defined by the fact that the threshold voltage in the left part of the cell and in the right part of the cell each lie on the "L" level and in contrast, state 2 is defined by the fact that in the left part of the cell and in the right part of the cell the threshold voltage respectively lies on the "L" level. Furthermore, state 3 is defined by the fact that the voltage in the left part of the cell lies on the "L" level and that in the right part lies on the "H" level, with state 4 being defined by the fact that the threshold voltage in the left part of the cell lies on the "H" level and that in the right part lies on the "L" level.

As one possible example the difference of the threshold voltages between the "L" level and the "H" level can be of about 1.5 V and the threshold voltage difference within the "L" level or the "H" level, that means between state 1 and 2 or state 3 or 4 respectively, can be of about 300 mV respectively. However, there are other differences possible in realization.

In the above-mentioned embodiment four states are described distributed on two levels. That means it is a two-bit memory cell. In addition to the "H" level and the "L" level, one or more levels that define additional bits can be stored in one memory cell in an analogous way.

The advantage of the state definition according to FIG. 4 can be seen in the fact that in each case, the difference between the left part of the cell and the right part of the cell is programmed, with both threshold voltage levels lying within the same region. Larger threshold voltage differences never occur between the two sides of one cell.

During programming of state 3 of the known method, the threshold voltage of the right side is significantly raised above that of the left side. Crosstalk can result in the left part of the cell being raised as well.

Figure 2:
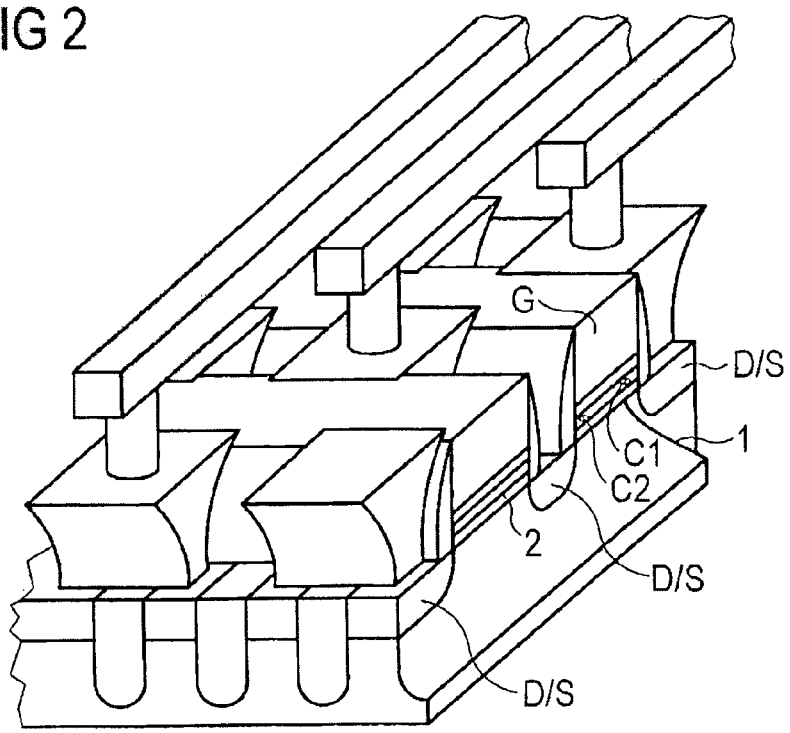
FIG. 2 is a second exemplary embodiment of an NROM memory cell.

A different arrangement of an NROM memory cell is shown in a three-dimensional view according to FIG. 2 wherein the substantial difference is merely to be seen in the contacting of the gate contact G and the drain/source regions D/S compared with the exemplary embodiment shown in FIG. 1. Here also two charge regions C1 and C2 are provided within the gate structure in which charge is embedded or erased. The programming according to the invention can be used for both the exemplary embodiments of NROM memory cells shown and also for other memory cells having a gate structure with at least two local storage areas having influence on an effective parameter, for an example the threshold voltage.

Figure 3:
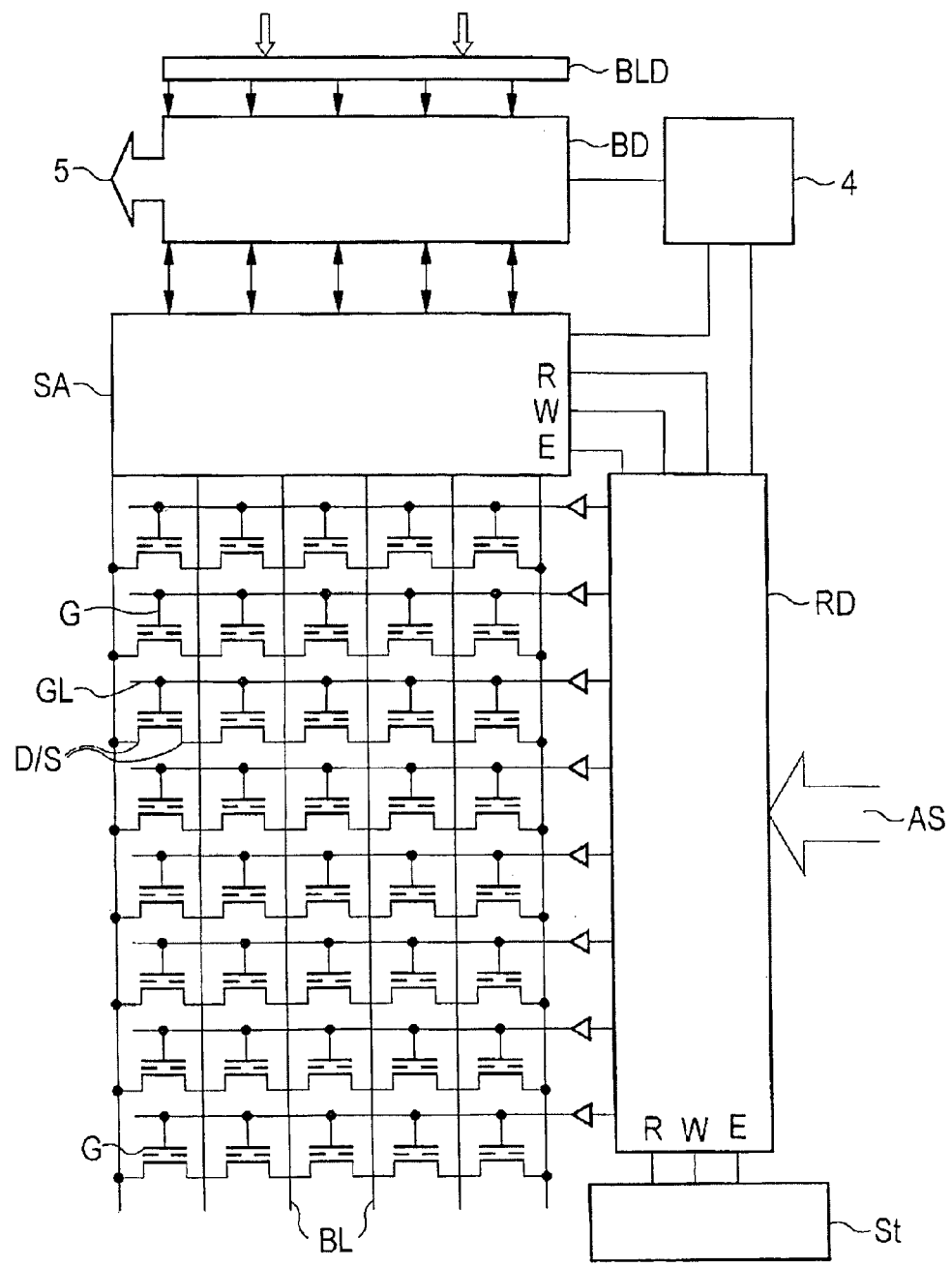
FIG. 3 is a conventional memory cell array for NROM cells.

According to FIG. 3, a conventional memory cell arrangement for non-volatile memories is shown, which can be used for the method according to the invention. A plurality of rows of memory cells is shown wherein in each row one drain/source connection D/S of one cell is connected to one drain/source connection D/S of the neighboring cell. The drain/source connections are connected to bit lines BL and are controlled by means of a so-called sense amplifier SA. The gate connections G of the individual memory cells within one row are controlled by a series decoder RD by means of respective gate lines GL. The memory cells are addressed via the series decoder RD and via a bit line decoder BLD.

Arranged between the bit line decoder BLD and the sense amplifier SA is a multi-bit decoder BD, which ensures that the respective threshold voltage difference is set to the respective desired level, as described previously, during a programming process in the memory cells or which determines the programmed state at the respective level from the threshold voltage difference by forward and backward reading of the respective memory cells and delivers to the data output 5. The multi-bit decoder BD consequently comprises a device for producing a threshold voltage difference in the individual memory cells and a device for detecting such a threshold voltage difference. The interaction between the bit decoder, the sense amplifier and the series decoder RD is controlled via a clock control 4. Finally a state control ST is provided, which specifies whether a read process R, a write process W or an erase process E is provided.

The above embodiment is directed to a NROM cell. However the invention is not restricted to that but can be applied to each memory cell having at least two separate storage areas having influence on an effective parameter of the memory cell.

What is claimed is:

1. A method for operating an electrically writable and erasable memory cell, which has a channel region being operated in a first and a second direction, the memory cell characterized by at least one effective parameter, the method comprising:
    providing the memory cell, wherein:
        information is stored in the memory cell as one of at least three possible states,
        each of the at least three possible states comprises an associated magnitude and a difference,
        a first of the at least three possible states comprises a first magnitude and a first dfference;
        a second of the at least three possible states comprises the first magnitude and a second difference, the second difference less than the first difference;
        a third of the at least three possible states comprises a second magnitude and a third difference;
    an absolute value of each difference is less than an absolute value of a difference between the first magnitude and the second magnitude;
        each difference comprises a difference between the effective parameter in operation of the channel region in the first direction and the effective parameter in operation of the channel region in the second direction,
        each magnitude comprises an average of the effective parameter in operation of the channel region in the first direction and the effective parameter in operation of the channel region in the second direction; and
    retrieving the stored information from the memory cell.

2. The method according to claim 1, wherein the first difference is greater than zero and the second difference is less than zero.

3. The method according to claim 2, wherein the memory cell includes a memory cell transistor having a threshold voltage and wherein the effective parameter is the threshold voltage of a memory cell transistor.

4. The method according to claim 3, wherein the threshold voltage is stipulated within a pre-determined voltage range.

5. The method according to claim 4, wherein further information is stipulated within further pre-determined voltage ranges.

6. The method according to claim 1, wherein providing the memory cell comprises providing a memory device that includes a memory cell field that includes the memory cell and wherein retrieving the stored information comprises utilizing a reading device operatively coupled to the memory cell, the reading device operable to determine the difference of the effective parameter of the memory cell when operating the channel region in the first direction and the effective parameter of the memory cell when operating the channel region in the second direction and determine a programming state based upon that difference.

7. The method according to claim 6, wherein the stored information comprises one bit.

8. The method according to claim 7, wherein providing the memory cell comprises providing an NROM memory cell element.

9. The method according to claim 8, wherein providing the memory cell comprises providing a memory cell that includes a first oxide layer adjacent the channel region, a nitride layer adjacent the first oxide layer, and a second oxide layer adjacent the nitride layer.

10. The method according to claim 9, wherein the information is stored in the memory cell by a local charge storage means.

11. A method for operating an electrically writable and erasable memory cell, which has a channel region being operated in a first and a second direction, the memory cell characterized by at least one effective parameter, the method comprising:
    storing information in the memory cell, wherein information is stored as a difference between the effective parameter in operation of the channel region in the first direction and the effective parameter in operation of the channel region in the second direction, and as an average of the effective parameter in operation of the channel region in the first direction and the effective parameter in operation of the channel region in the second direction, and wherein the information is stored as one of at least four states, each state comprising a unique combination of a difference and a magnitude, wherein an absolute value of each difference for each state is less then half of a difference between a logic High level and a logic Low level.

12. The method according to claim 11, wherein two of the at least four separate states are distinguished by a positive difference and a negative difference.

13. The method according to claim 11, wherein the memory cell includes a memory cell transistor having a threshold voltage and wherein the effective parameter is the threshold voltage of a memory cell transistor.

14. The method according to claim 13, wherein the threshold voltage is stipulated within a pre-determined voltage range.

15. The method according to claim 14, wherein further information is stipulated within further pre-determined voltage ranges.

16. The method according to claim 11, wherein storing information in the memory cell comprises utilizing a writing device that adjusts a storage area of the memory cell such that information to be stored is converted into a threshold voltage difference of the channel region.

17. The method according to claim 16, wherein the information to be stored comprises one bit.

18. The method according to claim 17, wherein the memory cell comprises an NROM memory cell element.

19. The method according to claim 18, wherein the memory cell includes a first oxide layer adjacent the channel region, a nitride layer adjacent the first oxide layer, and a second oxide layer adjacent the nitride layer.

20. The method according to claim 18, wherein the storage area of the memory cell comprises a local charge storage means.

21. The method according to claim 2, wherein the first difference is equal but opposite of the second difference.

22. The method according to claim 1, wherein the first magnitude comprises a threshold voltage corresponding to a low level, and wherein the second magnitude comprises a threshold voltage corresponding to a high level.

23. The method according to claim 1, wherein
the absolute value between the first magnitude and the second magnitude is about 1.5 V;
the first difference is about 300mV; and
the second difference is about −300 mV.

24. The method according to claim 12, wherein the positive difference and the negative difference comprise approximately a same absolute value.

25. The method according to claim 7, wherein the one bit is encoded using the first and second of the at least three possible states.

26. The method according to claim 1, wherein:
the third difference is greater than zero; and
a fourth of the at least three possible states comprises the second magnitude and a fourth difference, the fourth difference less than zero.

27. The method according to claim 26, wherein the stored information comprises at least two bits, wherein the at least two bits are encoded using the first, second, third and fourth of the at least three possible states.

28. A method for operating a NROM memory cell, the method comprising:
coding a single bit according to a relationship between a first offset and a second offset,
wherein
a first state comprises the first offset greater than the second offset; and
a second state comprises the second offset greater than the first offset;
programming a first location of the NROM memory cell at about a first logic level plus the first offset;
programming a second location of the NROM memory cell at the first logic level plus the second offset, wherein the first and second offsets are less than one half of a difference between the first logic level and a second logic level, wherein an absolute value of a difference between the first logic level and the second logic level comprises an absolute value of a difference between a high logic level and a low logic level.

29. The method of claim 28, further comprising:
reading the first memory location and the second memory location;
decoding the first state if the first offset is greater than the second offset; and
decoding the second state if the first offset is less than or equal to the second offset.

30. A method for operating a NROM memory cell, the method comprising:
coding at least two bits according to a relationship between a first offset, a second offset, a first logic level and a second logic level wherein
a first state comprises the first offset greater than the second offset and the first logic level,
a second state comprises the second offset greater than the first offset and the first logic level,
a third state comprises the first offset greater than the second offset and the second logic level, and
a fourth state comprises the second offset greater than the first offset and the second logic level;
programming a first location of the NROM memory cell with the first logic level plus the first offset if the first or second states are coded;
programming the first location of the NROM memory cell with the second logic level plus the first offset if the third or fourth states are coded;
programming a second location of the NROM memory cell with the first logic level plus the second offset if the first or second states are coded;
programming the second location of the NROM memory cell with the second logic level plus the second offset if the third or fourth states are coded, wherein the first and second offsets are less than one half of a difference between the first logic level and a second logic level, and wherein an absolute value of a difference between the first logic level and the second logic level comprises an absolute value of a difference between a high logic level and a low logic level.

31. The method of claim 30, further comprising:
reading the first memory location and the second memory location;
decoding the first, second, third or fourth states.

32. The method of claim 31, further comprising mapping the first, second, third or fourth states into two bits.

33. A memory device for electrically readable and erasable information memories, the memory device comprising:
a memory cell field with at least one memory cell that has a channel region between a drain region and a source region, the channel region being bi-directionally operable, the memory cell further including a storage area that is adjustable such that an effective parameter of the memory cell when operating the channel region in a first direction is different than the effective parameter of the memory cell when operating the channel region in the second direction; and
a reading device operatively coupled to the memory cell, the reading device operable to determine the difference of the effective parameter of the memory cell when operating the channel region in the first direction and the effective parameter of the memory cell when operating the channel region in the second direction and determine a programming state based upon that difference, wherein information is stored as one of at least four states, each state comprising a unique combination of a difference and a magnitude, wherein an absolute value of each difference for each state is less then half of a difference between a logic High level and a logic Low level.

34. The memory device according to claim 33, further comprising a writing device that adjusts the storage area such that information to be stored is converted into a threshold voltage difference of the channel region.

35. The memory device according to claim 34, wherein the information to be stored comprises two bits.

36. The memory device according to claim 34, wherein the information to be stored comprises one bit.

37. The memory device according to claim 36, wherein the one bit is mapped to two of the at least four states, the two of at least four states comprising a same magnitude.

38. The memory device according to claim 36, wherein the memory cell is an NROM memory cell element.

39. The memory device according to claim 38, wherein the memory cell includes a first oxide layer adjacent the channel region, a nitride layer adjacent the first oxide layer, and a second oxide layer adjacent the nitride layer.

40. The memory device according to claim 38, wherein the storage area of the memory cell comprises a local charge storage means.

41. The memory device according to claim 33, wherein the reading device is further operable to determine a magnitude of the effective parameter of the memory cell.

42. The method of claim 6, wherein the reading device is further operable to determine a magnitude of the effective parameter of the memory cell.

43. The method according to claim 11, wherein storing infonnation in the memory cell comprises utilizing a writing device that adjusts a storage area of the memory cell such that information to be stored is converted into a threshold voltage magnitude and a threshold voltage difference of the channel region.

* * * * *